US012696771B2

(12) United States Patent
Baello et al.

(10) Patent No.: US 12,696,771 B2
(45) Date of Patent: Jul. 28, 2026

(54) SEMICONDUCTOR PACKAGE WITH FLIP CHIP SOLDER JOINT CAPSULES

(71) Applicant: TEXAS INSTRUMENTS INCORPORATED, Dallas, TX (US)

(72) Inventors: James Raymond Maliclic Baello, Pampanga (PH); Steffany Ann Lacierda Moreno, Bamban (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/166,440

(22) Filed: Feb. 8, 2023

(65) Prior Publication Data

US 2023/0187223 A1     Jun. 15, 2023

Related U.S. Application Data

(62) Division of application No. 16/732,293, filed on Dec. 31, 2019, now Pat. No. 11,600,498.

(51) Int. Cl.
H01L 23/498 (2006.01)
H01L 23/29 (2006.01)
(Continued)

(52) U.S. Cl.
CPC ....... H10W 70/098 (2026.01); H10W 70/479 (2026.01); H10W 74/137 (2026.01); H10W 74/40 (2026.01); H10W 72/07231 (2026.01)

(58) Field of Classification Search
CPC . H01L 21/4867; H01L 23/29; H01L 23/3171; H01L 23/49861; H01L 2021/60097; H01L 2224/13147; H01L 24/13; H01L 24/16; H01L 24/81; H01L 2224/10126; H01L 2224/13082; H01L 2224/13111; H01L 2224/1319; H01L 2224/13564; H01L 2224/1357; H01L 2224/1369; H01L 2224/16058;
(Continued)

(56) References Cited

U.S. PATENT DOCUMENTS 6,578,755 B1    6/2003   Elenius
7,800,208 B2    9/2010   Otremba
(Continued)

OTHER PUBLICATIONS

Indium Corporation, Flip-Chip Epoxy Flux PK-005, Product Data Sheet, Nov. 2008, Utica, NY.
(Continued)

*Primary Examiner* — Duy T Nguyen
(74) *Attorney, Agent, or Firm* — Ronald O. Neerings; Frank D. Cimino

(57) ABSTRACT

A semiconductor package includes a leadframe forming a plurality of leads with a die attach site, a semiconductor die including a set of die contacts mounted to the die attach site in a flip chip configuration with each die contact of the set of die contacts electrically connected to leadframe via one of a set of solder joints, a set of solder joint capsules covering each of the set of solder joints against the leadframe, a clip mounted to the leadframe over the semiconductor die with a clip solder joint. The solder joint capsules restrict flow of the solder joints of the semiconductor die contacts in the flip chip configuration such that the solder remains in place if remelted during later clip solder reflow.

22 Claims, 10 Drawing Sheets

FIG. 1D

(51) Int. Cl.

| | |
|---|---|
| *H01L 23/31* | (2006.01) |
| *H10W 70/05* | (2026.01) |
| *H10W 70/40* | (2026.01) |
| *H10W 74/10* | (2026.01) |
| *H10W 74/40* | (2026.01) |
| *H01L 21/48* | (2006.01) |
| *H01L 21/60* | (2006.01) |
| *H10W 72/00* | (2026.01) |

(58) Field of Classification Search

CPC . H01L 2224/16245; H01L 2224/81191; H01L 2224/81193; H01L 2224/81355; H01L 2224/81815; H01L 2224/81862; H01L 2224/81885; H01L 2224/81911; H01L 23/3107; G01R 15/202; G01R 15/207; G01R 33/072; G01R 33/0047

USPC ........................................................ 257/666

See application file for complete search history.

(56) References Cited

U.S. PATENT DOCUMENTS

| | | | | | |
|---|---|---|---|---|---|
| 8,450,859 | B2 | 5/2013 | Ohashi | | |
| 8,717,016 | B2 | 5/2014 | Ausserlechner | | |
| 8,822,273 | B2 | 9/2014 | Kuo | | |
| 9,184,117 | B2 * | 11/2015 | Ho | | H01L 24/40 |
| 9,184,152 | B2 | 11/2015 | Kuo | | |
| 9,564,410 | B2 | 2/2017 | Camenforte, III | | |
| 9,589,929 | B2 | 3/2017 | Terrill | | |
| 9,595,503 | B2 | 3/2017 | Kuo | | |
| 9,865,802 | B2 | 1/2018 | Ausserlechner | | |
| 9,966,330 | B2 | 5/2018 | Terrill | | |
| 10,229,893 | B2 | 3/2019 | Kuo | | |
| 10,510,728 | B2 | 12/2019 | Wang | | |
| 10,546,840 | B2 | 1/2020 | Terrill | | |
| 10,593,640 | B2 | 3/2020 | Baello | | |
| 2004/0080308 | A1 | 4/2004 | Goto | | |
| 2005/0020051 | A1 * | 1/2005 | Tsai | | H01L 24/13 |
| | | | | | 257/E23.021 |
| 2006/0192280 | A1 | 8/2006 | Esler | | |
| 2006/0252177 | A1 * | 11/2006 | Shim, II | | H01L 21/67092 |
| | | | | | 438/106 |
| 2007/0037319 | A1 | 2/2007 | Chan | | |
| 2007/0040252 | A1 * | 2/2007 | Hosseini | | H01L 23/49562 |
| | | | | | 257/676 |
| 2007/0096270 | A1 * | 5/2007 | Pavier | | H01L 23/4334 |
| | | | | | 257/E23.044 |
| 2007/0170533 | A1 | 7/2007 | Doogue | | |
| 2009/0057852 | A1 | 3/2009 | Madrid | | |
| 2009/0072379 | A1 * | 3/2009 | Ewe | | H01L 21/76871 |
| | | | | | 257/700 |
| 2010/0193921 | A1 * | 8/2010 | Jereza | | H01L 24/39 |
| | | | | | 257/676 |
| 2010/0246152 | A1 | 9/2010 | Lin | | |
| 2011/0095423 | A1 | 4/2011 | Ohashi | | |
| 2011/0204887 | A1 | 8/2011 | Ausserlechner | | |
| 2012/0112331 | A1 | 5/2012 | Kuo | | |
| 2012/0228696 | A1 * | 9/2012 | Carpenter | | H01L 23/49575 |
| | | | | | 257/329 |
| 2013/0113114 | A1 * | 5/2013 | Hosseini | | H01L 23/49562 |
| | | | | | 257/E23.141 |
| 2013/0207255 | A1 | 8/2013 | Magnus | | |
| 2014/0117523 | A1 | 5/2014 | Ho | | |
| 2014/0203423 | A1 * | 7/2014 | Hayashi | | H01L 23/34 |
| | | | | | 438/122 |
| 2014/0218886 | A1 | 8/2014 | Nomura | | |
| 2014/0239426 | A1 | 8/2014 | Ausserlechner | | |
| 2014/0264611 | A1 | 9/2014 | Lee | | |
| 2014/0264804 | A1 | 9/2014 | Terrill | | |
| 2014/0273344 | A1 * | 9/2014 | Terrill | | H01L 24/92 |
| | | | | | 438/107 |
| 2014/0332939 | A1 | 11/2014 | Kuo | | |
| 2014/0370661 | A1 | 12/2014 | Kuo | | |
| 2015/0014829 | A1 * | 1/2015 | Abbott | | H01L 23/3107 |
| | | | | | 438/123 |
| 2015/0102425 | A1 * | 4/2015 | Sun | | H10D 30/021 |
| | | | | | 257/401 |
| 2015/0162292 | A1 | 6/2015 | Machida | | |
| 2015/0221584 | A1 | 8/2015 | Lopez | | |
| 2016/0163616 | A1 | 6/2016 | Fachmann | | |
| 2017/0012012 | A1 | 1/2017 | Camenforte, III | | |
| 2017/0120396 | A1 | 5/2017 | Ohashi | | |
| 2017/0162403 | A1 | 6/2017 | Terrill | | |
| 2017/0222131 | A1 | 8/2017 | Chew | | |
| 2017/0271304 | A1 | 9/2017 | Kuo | | |
| 2018/0158765 | A1 * | 6/2018 | Montero | | H01L 24/49 |
| 2018/0166415 | A1 | 6/2018 | Khaselev | | |
| 2018/0190608 | A1 | 7/2018 | Gupta | | |
| 2018/0240770 | A1 | 8/2018 | Choi | | |
| 2019/0122971 | A1 | 4/2019 | Wang | | |
| 2019/0214368 | A1 | 7/2019 | Wang | | |
| 2019/0326245 | A1 | 10/2019 | Baello | | |
| 2020/0161242 | A1 | 5/2020 | Lin | | |
| 2020/0357987 | A1 * | 11/2020 | Li | | G01R 15/202 |
| 2021/0050300 | A1 | 2/2021 | Lin | | |
| 2021/0066239 | A1 | 3/2021 | Moreno | | |

OTHER PUBLICATIONS

Alpha Advanced Materials, Alpha® NCX PRL-3200, Technical Data Sheet, Feb. 2017, Suwanee, GA.

Alpha Advanced Materials, Alpha® NCX-PRL507, Technical Data Sheet, Apr. 2017, Suwanee, GA.

High Lead Solder Failure and Microstructure Analysis in Die Attack Power Discrete Packages, Jun. 18, 2021, 6 pages.

\* cited by examiner

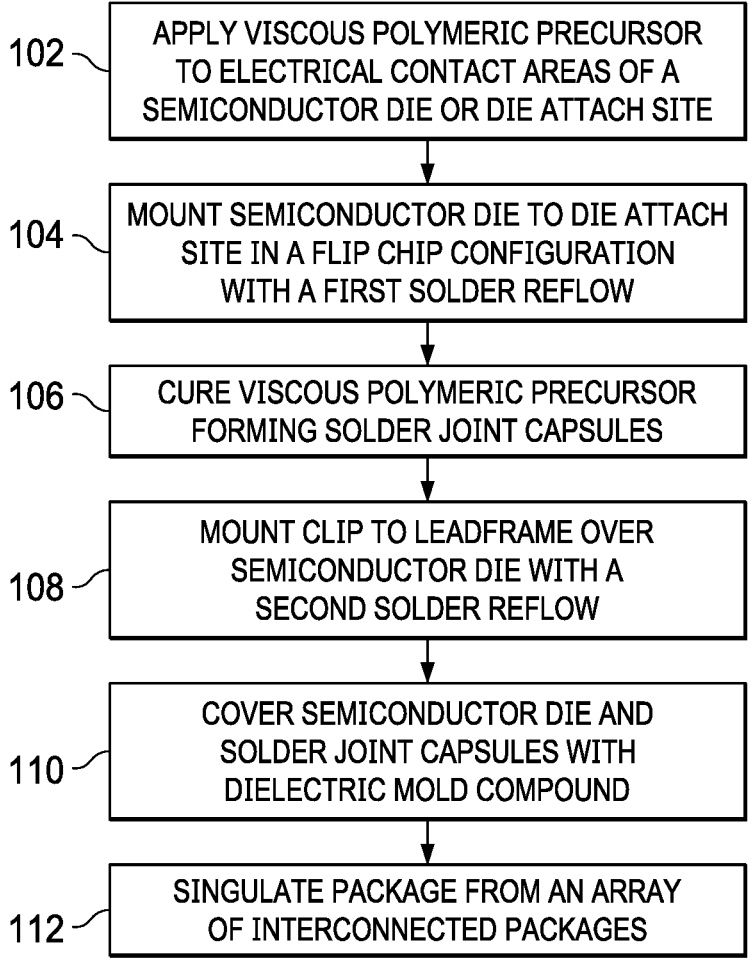

102 — APPLY VISCOUS POLYMERIC PRECURSOR TO ELECTRICAL CONTACT AREAS OF A SEMICONDUCTOR DIE OR DIE ATTACH SITE

104 — MOUNT SEMICONDUCTOR DIE TO DIE ATTACH SITE IN A FLIP CHIP CONFIGURATION WITH A FIRST SOLDER REFLOW

106 — CURE VISCOUS POLYMERIC PRECURSOR FORMING SOLDER JOINT CAPSULES

108 — MOUNT CLIP TO LEADFRAME OVER SEMICONDUCTOR DIE WITH A SECOND SOLDER REFLOW

110 — COVER SEMICONDUCTOR DIE AND SOLDER JOINT CAPSULES WITH DIELECTRIC MOLD COMPOUND

112 — SINGULATE PACKAGE FROM AN ARRAY OF INTERCONNECTED PACKAGES

FIG. 4

SEMICONDUCTOR PACKAGE WITH FLIP CHIP SOLDER JOINT CAPSULES

TECHNICAL FIELD

This disclosure relates to semiconductor packages.

BACKGROUND

Current sensors may include a current path with a sensor coil and an adjacent magnetic sensor, such as a Hall effect sensor, which detects an electromagnetic field emanating from the sensor coil from current through the sensor coil. Within the present application and as currently described in the power circuits industry, low voltage is considered as below 50 volts, high voltage is defined as a voltage greater than 50 volts and less than 5,000 volts. Extra-high voltage is a voltage greater than 5,000 volts. Particularly with respect to high voltage and extra-high voltage, a sensor coil and sensor may be implemented separately within a semiconductor package rather than as part of an integrated circuit.

BRIEF SUMMARY

Semiconductor packages disclosed herein include a leadframe with a semiconductor die mounted thereon in a flip chip configuration, and a clip soldered to the leadframe and over the semiconductor die. In an example manufacturing process, the semiconductor die is mounted to the leadframe in a flip chip configuration with a first solder reflow, and the clip is mounted to the leadframe over the semiconductor die with a second solder reflow. However, the clip solder reflow may remelt the solder of the flip chip connection. The package includes solder joint capsules surrounding each solder joint of the semiconductor die contacts in the flip chip configuration such that the solder remains in place if remelted during the later clip solder reflow. In some examples, the leadframe and the clip form sensor coils, and the semiconductor die includes a magnetic sensor configured to detect magnetic fields caused by electrical current through the sensor coils.

In one example, a semiconductor package includes a leadframe forming a plurality of leads with a die attach site, a semiconductor die including a set of die contacts mounted to the die attach site in a flip chip configuration with each die contact of the set of die contacts electrically connected to leadframe via one of a set of solder joints, a set of solder joint capsules covering each of the set of solder joints against the leadframe, and a clip mounted to the leadframe over the semiconductor die with a clip solder joint.

In another example, a method for fabricating a semiconductor package includes applying a viscous polymeric precursor to either each of a set of die contacts of a semiconductor die, or to electrical contact areas of a die attach site of a leadframe, positioning the semiconductor die on the die attach site in a flip chip configuration with the viscous polymeric precursor covering solder of each of the set of die contacts, reflowing the solder of each of the set of die contacts to form a set of solder joints to electrically connect each die contact of the set of die contacts to the electrical contact areas of leadframe in the flip chip configuration, curing the viscous polymeric precursor to form a set of solder joint capsules covering each of the set of solder joints against the leadframe, positioning a clip on the leadframe over the semiconductor die, and reflowing solder between the clip and the leadframe to form a clip solder joint.

In a further example, a semiconductor package includes a leadframe forming a plurality of die leads with a die attach site, sensor coil leads and a first sensor coil between the sensor coil leads, a semiconductor die including a set of metal pillars mounted to the die attach site in a flip chip configuration with each metal pillars of the set of metal pillars electrically connected to leadframe via one of a set of solder joints, and a set of solder joint capsules covering each of the set of solder joints against the leadframe. Each of the set of metal pillars extends from an opening of a dielectric layer on an active side of the semiconductor die, through one of the set of solder joint capsules, and to one of the set of solder joints. The semiconductor package further includes a clip mounted to the leadframe over the semiconductor die with a clip solder joint. The clip includes a second sensor coil, the second sensor coil forming a parallel conductive path with the first sensor coil via the clip solder joint. The semiconductor die includes a sensor operable to detect magnetic fields created by electrical current through the first sensor coil and the second sensor coil, the semiconductor die operable to output a signal representative of the detected magnetic fields via the die leads. The semiconductor package further includes a dielectric mold compound covering the set of solder joints of the flip chip configuration and the set of solder joint capsules and at least partially covering the leadframe, the semiconductor die, and the clip. The dielectric mold compound contacts each of the set of metal pillars adjacent to the dielectric layer on the active side of the semiconductor die.

BRIEF DESCRIPTION OF THE DRAWINGS

FIG. 4 is a flowchart of a method of manufacturing a semiconductor package including a clip soldered to a leadframe, and a semiconductor die mounted to the leadframe in a flip chip configuration with solder joint capsules surrounding each solder joint of the semiconductor die contacts in the flip chip configuration, such as the semiconductor package of FIGS. 1A-1D.

DETAILED DESCRIPTION

Semiconductor packages disclosed herein include a leadframe with a semiconductor die mounted thereon in a flip chip configuration, and a clip soldered to the leadframe and over the semiconductor die. In order to manufacture the package, the semiconductor die is first mounted to the leadframe in a flip chip configuration with a first solder reflow, and the clip is mounted to the leadframe over the semiconductor die with a second solder reflow. However, the second solder reflow may remelt the solder of the flip chip connection between the leadframe and the semiconductor die. The package includes solder joint capsules surrounding each solder joint of the semiconductor die contacts in the flip chip configuration such that the solder remains in place if remelted during the later clip solder reflow.

Mold compound covers the semiconductor die, the sensor coils, and the solder joint capsules. Mold compound also fill gaps between the semiconductor die and the sensor coils to electrically isolate the semiconductor die from the sensor coils.

In some examples, the leadframe and the clip both form sensor coils, and the semiconductor die includes a magnetic sensor configured to detect magnetic fields caused by electrical current through the sensor coils. The semiconductor die includes a magnetic sensor and is located between the sensor coils of the leadframe and the clip. Semiconductor package 10, as described with respect to FIGS. 1A-1D, provides one example of these techniques.

Figure 1A:
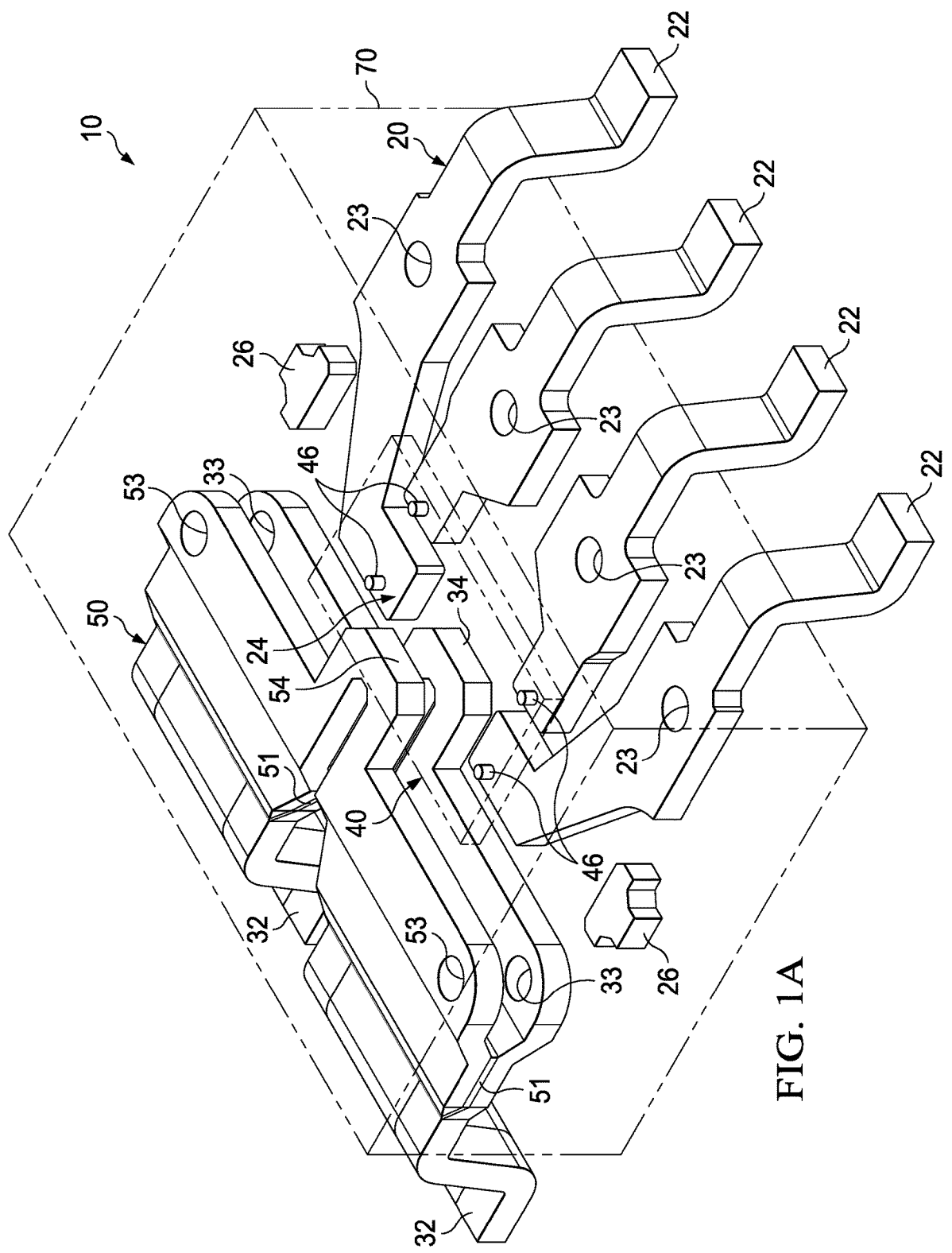
FIGS. 1A-1D illustrate a semiconductor package including a clip soldered to a leadframe, and a semiconductor die mounted to the leadframe in a flip chip configuration with solder joint capsules surrounding each solder joint of the semiconductor die contacts in the flip chip configuration.
Figure 1B:
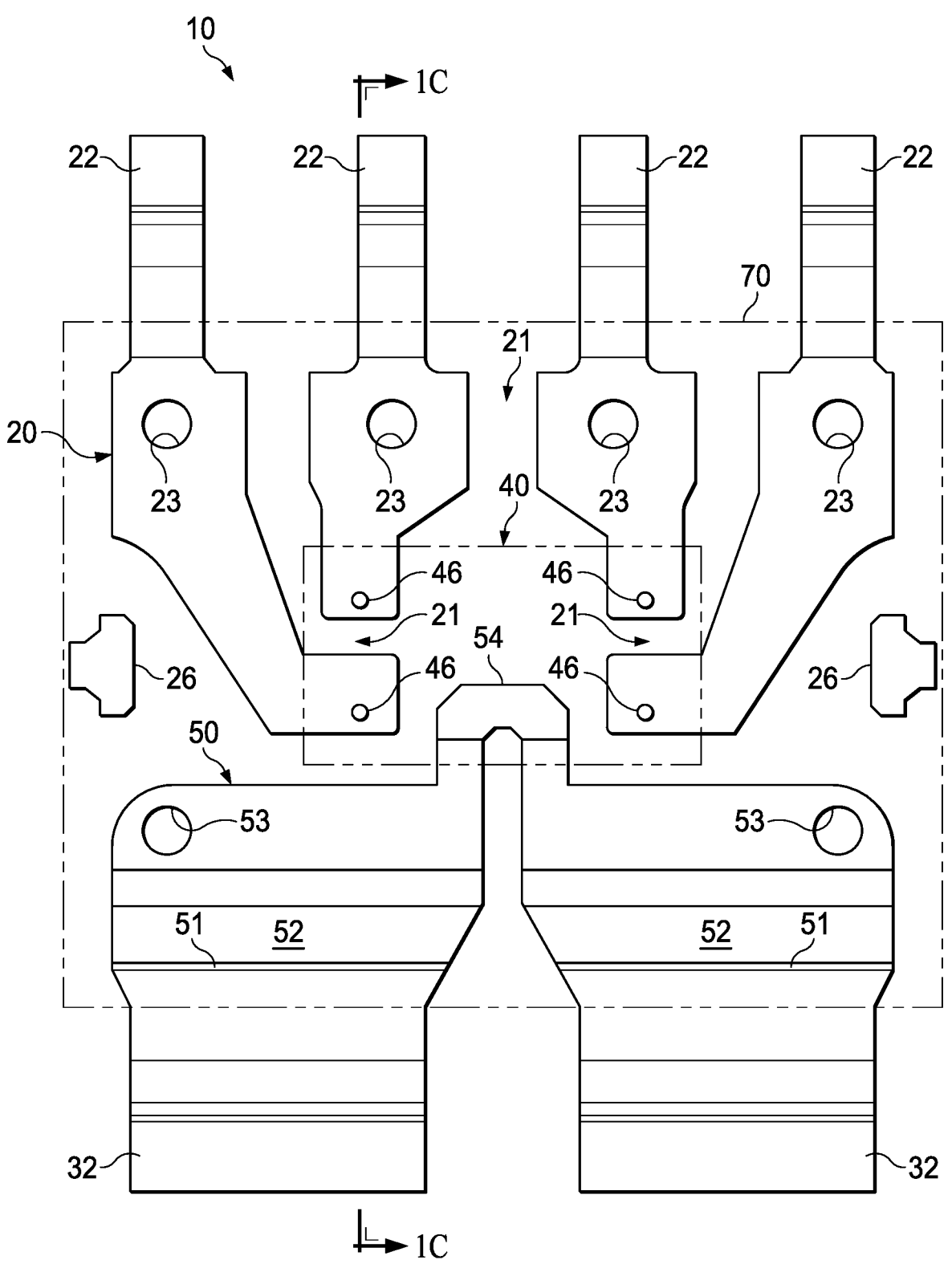
Figure 1C:
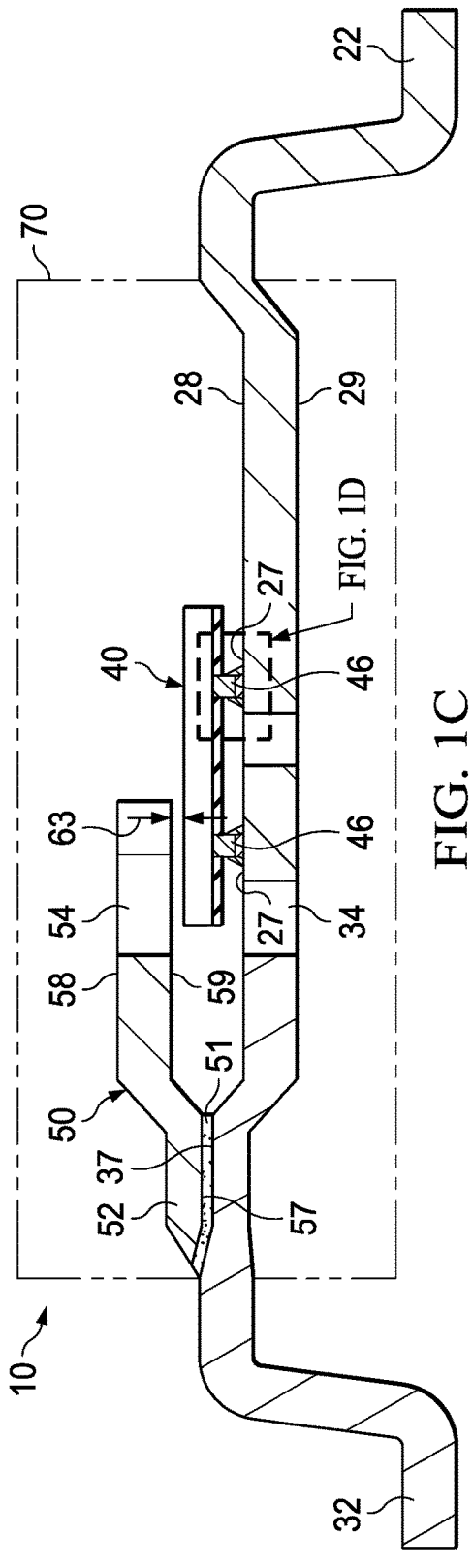
Figure 1D:
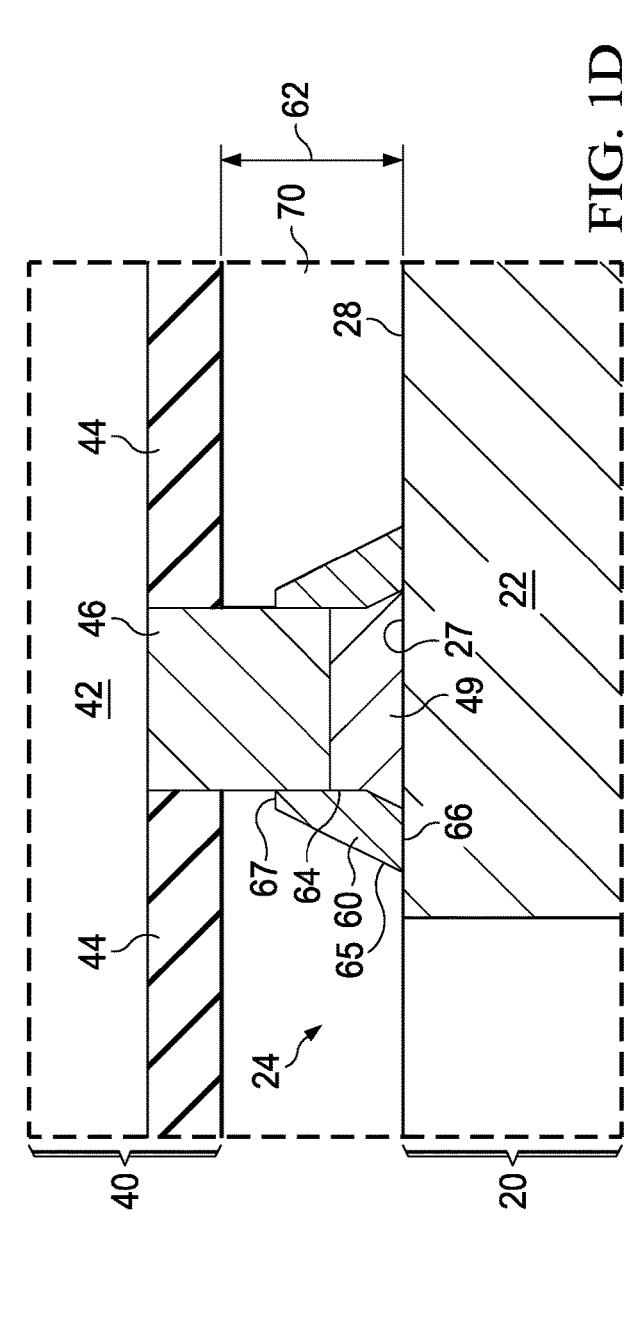

FIGS. 1A-1D illustrate semiconductor package 10. In particular, FIG. 1A is a perspective view of semiconductor package 10, while FIG. 1B is a top view of semiconductor package 10. FIG. 1C is a cutaway side view of semiconductor package 10, and FIG. 1D is enlarged portion of the cutaway side view of FIG. 1C.

Semiconductor package 10 includes a leadframe 20 including a sensor coil 34 between sensor coil leads 32. Leadframe 20 further includes a plurality of die leads 22 with a die attach site 24 physically and electrically separated from sensor coil 34. Semiconductor package 10 further includes clip 50 mounted to leadframe 20 over semiconductor die 40 with a clip solder joints 51. In this example, clip 50 includes a sensor coil 54, sensor coil 54 forming a parallel conductive path with sensor coil 34 via clip solder joints 51.

Semiconductor die 40 is mounted to die attach site 24 of die leads 22 between sensor coils 34, 54 to facilitate sensing magnetic fields from current through sensor coils 34, 54. Die leads 22 are physically and electrically separated from sensor coils 34, 54 such that die leads 22 and semiconductor die 40 is electrically isolated from sensor coils 34, 54. More specifically, semiconductor die 40 is positioned between sensor coil 34 and sensor coil 54 with a gap 62 (FIG. 1D) separating semiconductor die 40 from sensor coil 34 and a gap 63 (FIG. 1C) separating semiconductor die 40 from sensor coil 54.

Sensor coil 34 is a partial turn sensor coil, such as a half-turn sensor coil, formed as a unitary component with sensor coil leads 32 as part of leadframe 20. Sensor coil 34 and sensor coil leads 32 form a continuous electrical conductor. Sensor coil 54 is also a partial turn sensor coil, such as a half-turn sensor coil, and clip 50 is a unitary component including a base 52 and sensor coil 54. Specifically, clip solder contact areas 57 is secured to clip contact areas 37 of sensor coil leads 32 with clip solder joints 51 to mechanically and electrically connect clip 50 to sensor coil leads 32. Sensor coil 54 and base 52 form a continuous electrical conductor providing a parallel electrical path with that of sensor coil 34 and sensor coil leads 32. In some examples, clip solder joints 51 may include a high-lead solder. For example, a lead-free solder, such as tin or tin-silver alloy, may not be suitable for use in clip solder joints 51 due to limited flexibility, which may degrade solder joints 51 overtime, adversely affecting the performance and reliability of semiconductor package 10.

Semiconductor die 40 includes a magnetic sensor, such as a Hall effect sensor, and is operable to output a signal representative of the detected magnetic fields via die leads 22. In some examples, semiconductor die 40 is an integrated circuit including the sensor and a controller configured to receive an analog input from the sensor and output a digital signal representative of electrical current through sensor coils 34, 54 via one or more of die leads 22. In other examples, semiconductor die 40 may output an analog signal representing sensed magnetic fields via die leads 22.

Sensor coil leads 32 provide electrical contacts for connection to the current path being sensed, while die leads 22 provide electrical connections between semiconductor die 40 and external components, such as via a printed circuit board (PCB). In the example of semiconductor package 10, exposed portions of leads 22, 32 are bent in a common direction outside mold compound 70 and shaped as cantilevered leads. In other examples, leads 22, 32 may have other configurations, including but not limited to, a shape conforming to Small Outline No-Lead (SON) devices, such as Quad Flat No-Lead (QFN) devices.

As illustrated in FIG. 1D, semiconductor die 40 includes a semiconductor layer 42 including a magnetic sensor, and a dielectric layer 44 covering an active side of semiconductor layer 42. In some examples, dielectric layer 44 may be a solder mask layer, such as a polyimide layer. In the same or different examples, semiconductor layer 42 may include silicon, gallium nitride (GaN), such as GaN-on-silicon or GaN-on-silicon carbide, gallium arsenide or another semiconductor architecture.

Semiconductor die 40 is over leadframe 20 with copper pillars 46 electrically connected to die leads 22 with solder joints 49 in a flip chip configuration. Copper pillars 46 are formed from a copper or copper alloy, as is common with metal pillars used as die contacts for mounting semiconductor dies in a flip chip configuration. Other examples may utilize other metals for metal pillars, such as gold or a gold alloy.

Semiconductor package 10 further includes solder joint capsules 60 covering each of solder joints 49 against leadframe 20. Solder joint capsules 60 restrict flow of solder of each of copper pillars 46 during remelting of solder joints 49 to maintain the electrical connection between each of copper pillars 46 and electrical contact areas 27 of leadframe 20 in the flip chip configuration. Remelting of solder joints 49 may occur, for example, during reflow processing of clip solder joints 51.

Die leads 22 of leadframe 20 form spaces 21 in die attach site 24 between electrical contact areas 27 and the associated solder joints 49. Surface 28 of leadframe 20 faces solder joint capsule 60 and semiconductor die 40, including copper pillars 46, as well as mold compound 70 within gap 62. The opposing surface 29 of leadframe 20 is adjacent to mold compound 70.

Copper pillars 46 include solder joints 49 electrically connecting copper pillars 46 to die leads 22 in the flip chip configuration. Specifically, copper pillars 46 extend through bond pad openings in dielectric layer 44 and are bonded to a metallization layer (not shown) in semiconductor layer 42. Solder joints 49 are on top of copper pillars 46. In some examples, solder joints 49 may include a lead-free solder, such as tin or tin-silver alloy, such as tin with 0 to 2.5 percent by weight silver. For example, high-lead solders, as may be used to attach clip 50 to leadframe 20 may not be suitable for use due to a small size of solder caps 48 on copper pillars 46. Moreover, techniques for plating high-lead solders on copper pillars 46 are limited compared to available techniques for plating lead-free solder, such as tin or tin-silver alloy, as solder caps 48 on copper pillars 46.

Due to the arrangement of clip 50 over semiconductor die 40, manufacture of package 10 may include a first reflow to mount semiconductor die 40 to leadframe 20, and a second reflow to mount clip 50 to leadframe 20. In examples in which clip solder joints 51 is a high-lead solder, and solder joints 49 include a lead-free solder, such as tin or tin-silver alloy, reflow of clip solder joint may remelt solder joints 49. For example, lead-free solders may have a lower melting temperature, such as in a range of 210 to 260 degrees Celsius, compared to high-lead solder, which may have a melting temperature of 270 degrees Celsius or greater, such as in a range of 270 to 350 degrees Celsius. However, solder joint capsules 60 restrict flow of solder joints 49 to maintain the electrical connection between each of copper pillars 46 and the electrical contact areas of leadframe 20 in the flip chip configuration during remelting of solder joints 49.

For flip chip attachment of semiconductor die 40 to die attach site 24 of die leads 22, semiconductor die 40 is positioned with solder caps 48 (FIG. 2A) in contract with die leads 22 at die attach site 24. The assembly is heated to reflow solder caps 48 at die attach site 24 to form solder joints 49, thereby physically and electrically coupling copper pillars 46 with die leads 22. In this manner, copper pillars 46 represent the die contacts or bond pads of semiconductor die 40. Other die contacts may also be used, such as ball grid arrays.

Figure 2A:
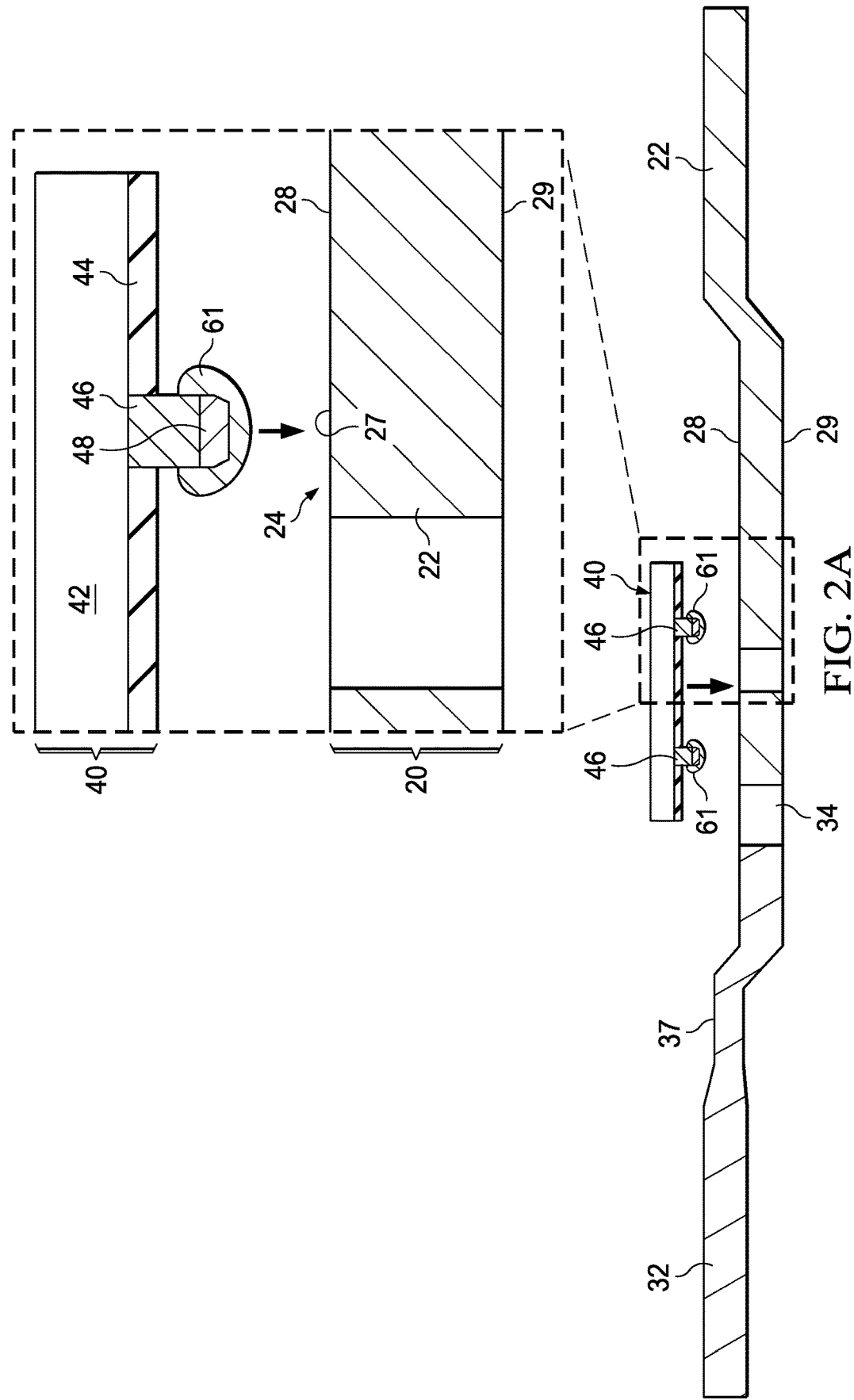
FIGS. 2A-2F illustrate conceptual process steps for manufacturing the semiconductor package of FIGS. 1A-1D.

In combination with the solder reflow of solder caps 48, a viscous polymeric precursor 61 such as an epoxy polymer flux, may be used to form solder joint capsules 60. In some examples, viscous polymeric precursor 61 applied to copper pillars 46 prior to curing to form solder joint capsules 60 (FIG. 2A). In other examples, viscous polymeric precursor 61 may be dispensed onto leadframe electrical contact areas 27 of die leads 22 prior to curing to form solder joint capsules 60 (FIG. 4).

Following the application of the viscous polymeric precursor 61, solder joints 49 are reflowed to mount semiconductor die 40 in the flip chip configuration on die attach site 24. In examples where epoxy polymer flux as viscous polymeric precursor 61, the flux supports the reflow of solder caps 48 at die attach site 24 to form solder joints 49 of the flip chip connection, for example, by removing oxidation from the base metal layers and promoting capillary flow of viscous solder between the base metal layers. In addition, viscous polymeric precursor 61 is cured to form solder joint capsules 60 covering each of solder joints 49 against leadframe 20. Following the curing, each copper pillar 46 extends between an opening of a dielectric layer 44 on an active side of semiconductor die 40 and one of solder joints 49, through one of solder joint capsules 60.

Solder joint capsules 60 enclose each of solder joints 49 between surface 28 of die leads 22 and copper pillars 46. For example, each solder joint capsule 60 may form a tubular profile covering a portion of a copper pillar 46 as well as all of the associated solder joint 49. As best shown in FIG. 1D, an inner surface 64 of the tubular profile is adjacent to a portion of a copper pillar 46 as well as all of the associated solder joint 49, while the outer surface in in contact with mold compound 70. End 66 of the solder joint capsule 60 terminates against surface 28 of a die lead 22, while the other end 67 terminates at junction of mold compound 70 and copper pillar 46 with the tubular profile extending past solder joint 49 along copper pillar 46.

While copper pillar 46 may have a generally cylindrical form, it is expected that the tubular profile of each solder joint capsule 60 will have irregular surfaces 64, 65. For example, inner surface 64 will have irregular surfaces to mate with copper pillar 46 and solder joint 49. In addition, outer surface 65 will also have irregular features as it is formed without a mold. Prior to and during curing of viscous polymeric precursor, its shape is only restricted by the viscosity and surface tension of viscous polymeric precursor 61.

In the illustrated examples, each solder joint capsule 60 encloses a single solder joint 49. In other examples, a common solder joint capsule 60 may include more than one solder joint 49 so long as each solder joint 49 enclosed by the common solder joint capsule 60 is along a common one of die leads 22. Spaces 21 (FIG. 1B) between die leads 22 prevents the viscous polymeric precursor 61 from covering solder joints 49 on separate die leads 22.

In some examples, the viscous polymeric precursor 61 may be heated, polymerized and "cured" to form solder joint capsules 60. In such examples, solder joint capsule 60 may include a resin such as an epoxy-based thermoset polymer. The resin of solder joint capsule 60 may be filled or unfilled and include one or more of the following: resin, hardener, curing agent, fused silica, inorganic fillers, catalyst, flame retardants, stress modifiers, adhesion promoters, and other suitable components. Fillers, if any, may be selected to modify properties and characteristics of the resin base materials. Inert inorganic fillers may be selected for a lower coefficient of thermal expansion, increase thermal conductivity, and/or increase elastic modulus of the underfill compared to the resin base. Particulate fillers may be selected to reduce strength characteristics such as tensile strength and flexural strength compared to the resin base materials.

Leadframes, such as leadframe 20, including leads 22, 32 and sensor coil 34, are formed on a single, thin sheet of metal as by stamping or etching. In various examples, the base metal of leadframe 20 may include copper, copper alloys, aluminum, aluminum alloys, iron-nickel alloys, or nickelcobalt ferrous alloys. For many devices, parallel surfaces of the flat leadframe base metal are treated to create strong affinity for adhesion to plastic compound, especially mold compounds. As an example, the surfaces of metal leadframes may be oxidized to create a metal oxide layer, such as copper oxide. Other methods include plasma treatment of the surfaces, or deposition of thin layers of other metals on the base metal surface. In some examples, the planar base metal may be plated with a plated layer enabling metal-tometal bonding and resistant to oxidation. In an example, the plated layer may include a layer of nickel plated on the base metal and a layer of palladium plated on the nickel layer. Some of such examples, a layer of gold may be plated on the palladium layer. As an example for copper leadframes, plated layers of tin may be used, or a layer of nickel, about 0.5 to 2.0 μm thick in some examples, followed by a layer of palladium, about 0.01 to 0.1 μm thick in the same or different examples, optionally followed by an outermost layer of gold, about 0.003 to 0.009 μm thick in the same or different examples. Such base metal and plating combinations provide resistance to corrosion, such as oxidation, at exposed portions of the leadframe while facilitating the flip chip connection between leadframe 20 and semiconductor die 40 at die attach site 24.

Dielectric mold compound 70 forms an overmold covering solder joints 49 and solder joint capsules 60 and at least partially covering leadframe 20, semiconductor die 40, and clip 50. In this manner, mold compound 70 provides a protective outer layer for the electric components of semiconductor package 10. Mold compound 70 fills gap 62 to electrically isolate semiconductor die 40 from sensor coil 34 and gap 63 to isolate semiconductor die 40 from sensor coil 54. As best illustrated in FIG. 1D, dielectric mold compound 70 contacts each of copper pillars 46 adjacent to dielectric layer 44 on the active side of semiconductor die 40 within gap 62.

Semiconductor layer 42 is separated from surface 28 of sensor coil 34 by gap 62, which is filled by mold compound 70, as well as dielectric layer 44, which is part of semiconductor die 40. In some particular examples, a thickness of dielectric layer 44 may be in a range of 5 micrometers (μm) to 20 μm such as 5 μm to 15 μm, such as at about 10 μm. As used herein, the term about refers to a range of manufacturing tolerances associated with the element being described. In the same or different particular examples, a thickness of mold compound 70 at gap 62 may be in a range of 20 μm to 200 μm such as 50 μm to 100 μm, such as at about 70 μm. While applications outside these ranges may exist, for high voltage and extra-high voltage, small gaps may result in electrical shorts and larger gaps may reduce sensing resolution.

Similarly, semiconductor layer 42 is separated from surface 59 of clip 50 by gap 63, which is also filled by mold compound 70. The opposing surface 58 of clip 50 is adjacent to mold compound 70. A thickness of mold compound 70 at gap 63 may be the same or similar to that of gap 62, such as in a range of 20 μm to 200 μm such as 50 μm to 100 μm, such as at about 70 μm. While applications outside these ranges may exist, for high voltage and extra-high voltage, smaller gaps may result in electrical shorts and larger gaps may reduce sensing resolution.

The height of gap 62 is set by the height of copper pillars 46, and the height of gap 63 is dependent on the arrangements of semiconductor die 40 and clip 50 on leadframe 20. Generally speaking, smaller gaps will increase the intensity of a magnetic forces detectable by the sensor of semiconductor die 40 due to current through sensor coils 34, 54. However, electrical isolation between sensor coils 34, 54 and semiconductor die 40 is required. For a given application, these competing factors are balanced to provide suitable sensing characteristics and reliable operation of semiconductor package 10, without electrical shorting between semiconductor die 40 and sensor coils 34, 54. Providing a solid dielectric material substantially free of voids, such as mold compound 70, may be important to protect against electrical shorts between sensor coils 34, 54 and semiconductor die 40, in particular with respect to high voltage and extra-high voltage applications.

In some examples, mold compound 70 includes a resin such as an epoxy-based thermoset polymer. The resin of mold compound 70 may be filled or unfilled and include one or more of the following: resin, hardener, curing agent, fused silica, inorganic fillers, catalyst, flame retardants, stress modifiers, adhesion promoters, and other suitable components. Fillers, if any, may be selected to modify properties and characteristics of the resin base materials. Inert inorganic fillers may be selected to lower CTE, increase thermal conductivity, increase elastic modulus of the mold compound compared to the resin base. Particulate fillers may be selected to reduce strength characteristics such as tensile strength and flexural strength compared to the resin base materials.

A maximum diameter of fillers of mold compound 70, if any, should be small enough to allow flow within gaps 62, 63 during molding to form semiconductor package 10. For example, mold compound 70 may include particulate fillers, such as silica and/or other particulate fillers, with a maximum diameter less than gaps 62, 63, such as no more than 95 percent of gaps 62, 63, such as no more than 75 percent of gaps 62, 63.

Die leads 22 form die lead apertures 23 filled with mold compound 70 and sensor coil leads 32 form sensor coil lead apertures 33 filled with mold compound 70. Likewise, clip 50 form clip apertures 53 filled with mold compound 70. Apertures 23, 33, 53 allow mold compound 70 to engage die leads 22, coil leads 32 and clip 50. Such engagement may be particularly important to resist delamination of mold compound 70 from leads 22, 32 when bending leads 22, 32 into their cantilevered shapes following molding with mold compound 70.

Usually die mounting, die to lead attachment, such as flip chip bonding, and molding to cover at least part of the leadframe and dies take place while the leadframes are still integrally connected as a leadframe strip. After such processes are completed, the leadframes, and sometimes mold compound of a semiconductor package, are severed ("singulated" or "diced") with a cutting tool, such as a saw or laser, within spaces separating the semiconductor dies from each other. These singulation cuts separate the leadframe strip into separate semiconductor packages, each semiconductor package including a singulated leadframe, at least one die, electrical connections between the die and leadframe (such a flip chip connection or wire bonds) and the mold compound which covers at least part of these structures.

Tie bars, such as tie bars 26, and siderails of a leadframe strip are removed or partially removed during singulation of the semiconductor packages formed with a single leadframe strip. The term leadframe represents the portions of the leadframe strip remaining within a semiconductor package after singulation. With respect to semiconductor package 10, leadframe 20 includes die leads 22 with die attach site 24, sensor coil leads 32 and sensor coil 34, as well as tie bars 26, although some of these elements are not interconnected following singulation of semiconductor package 10 into a discrete semiconductor package.

FIGS. 2A-2F are conceptual cutaway side views of process steps for manufacturing a semiconductor package including a clip soldered to a leadframe, and a semiconductor die mounted to the leadframe in a flip chip configuration with solder joint capsules surrounding each solder joint of the semiconductor die contacts in the flip chip configuration. FIG. 3 illustrates a conceptual process step providing an alternative to FIG. 2A. The cutaway side views of FIGS. 2A-2F and FIG. 3 are from the same perspective as FIG. 1C. FIG. 4 is a flowchart of a method of manufacturing a semiconductor package including semiconductor package including a clip soldered to a leadframe, and a semiconductor die mounted to the leadframe in a flip chip configuration with solder joint capsules surrounding each solder joint of the semiconductor die contacts in the flip chip configuration, such as semiconductor package 10. For clarity, the method of FIG. 4 is described with reference to semiconductor package 10 and FIGS. 2A-2F and FIG. 3; however, the described techniques may be adapted to other semiconductor package designs and are not limited to the specific example of semiconductor package 10.

As shown in FIG. 2A, viscous polymeric precursor 61, such as an epoxy polymer flux, is applied to each of copper pillars 46 of semiconductor die 40 (FIG. 4, step 102). For example, semiconductor die 40 may be partially dipped into a container of viscous polymeric precursor 61, dipping copper pillars 46 into the container of viscous polymeric precursor 61, to coat solder caps 48 in individual beads of viscous polymeric precursor 61.

Alternatively, as shown in FIG. 3, viscous polymeric precursor 61, such as an epoxy polymer flux, may be dispensed on electrical contact areas 27 of die attach site 24 of leadframe 20 rather than to each of copper pillars 46 (FIG. 4, step 102). For example, viscous polymeric precursor 61 may be screen printed on electrical contact areas 27 of die leads 22.

Figure 2B:
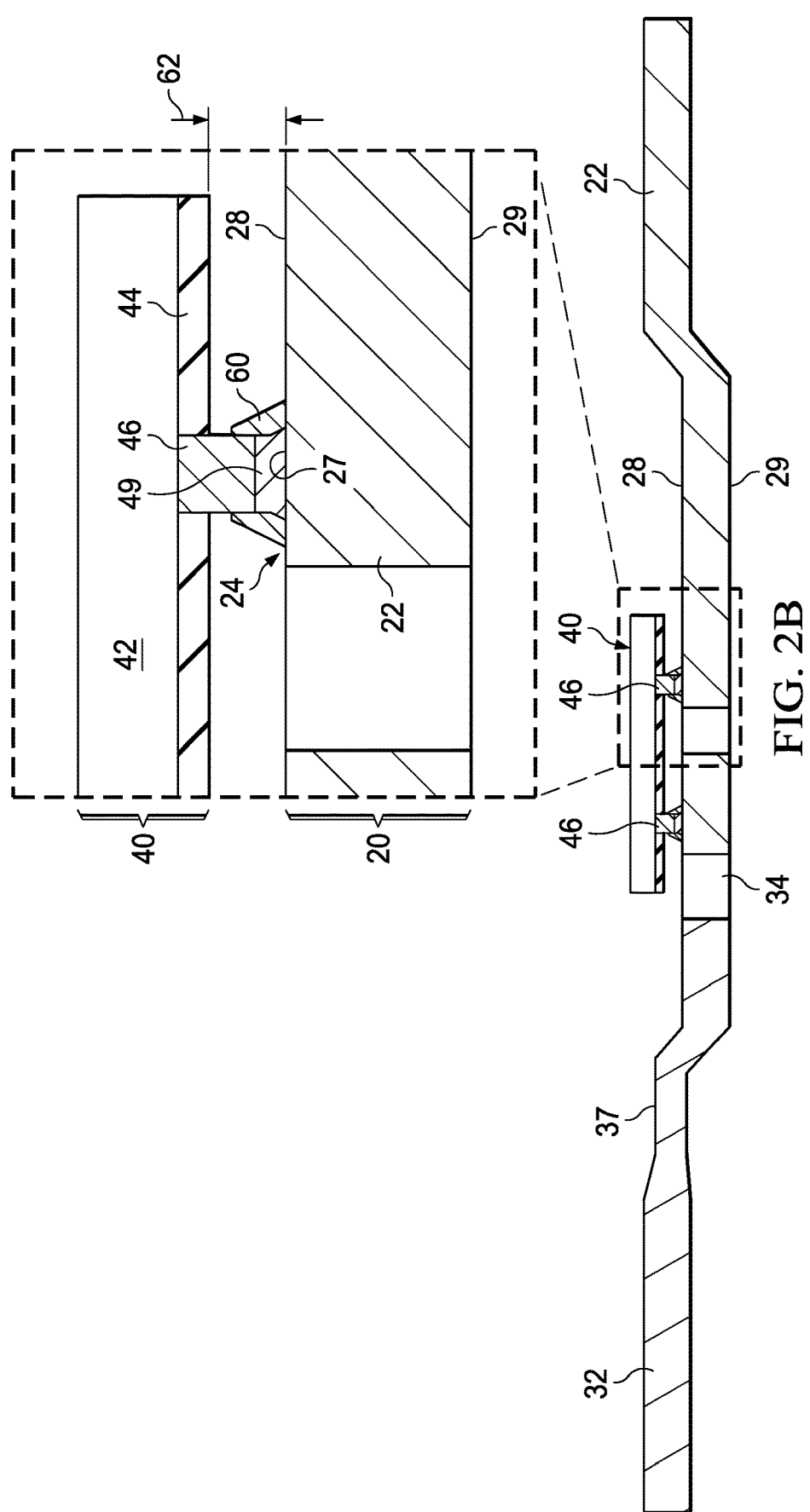
Figure 3:
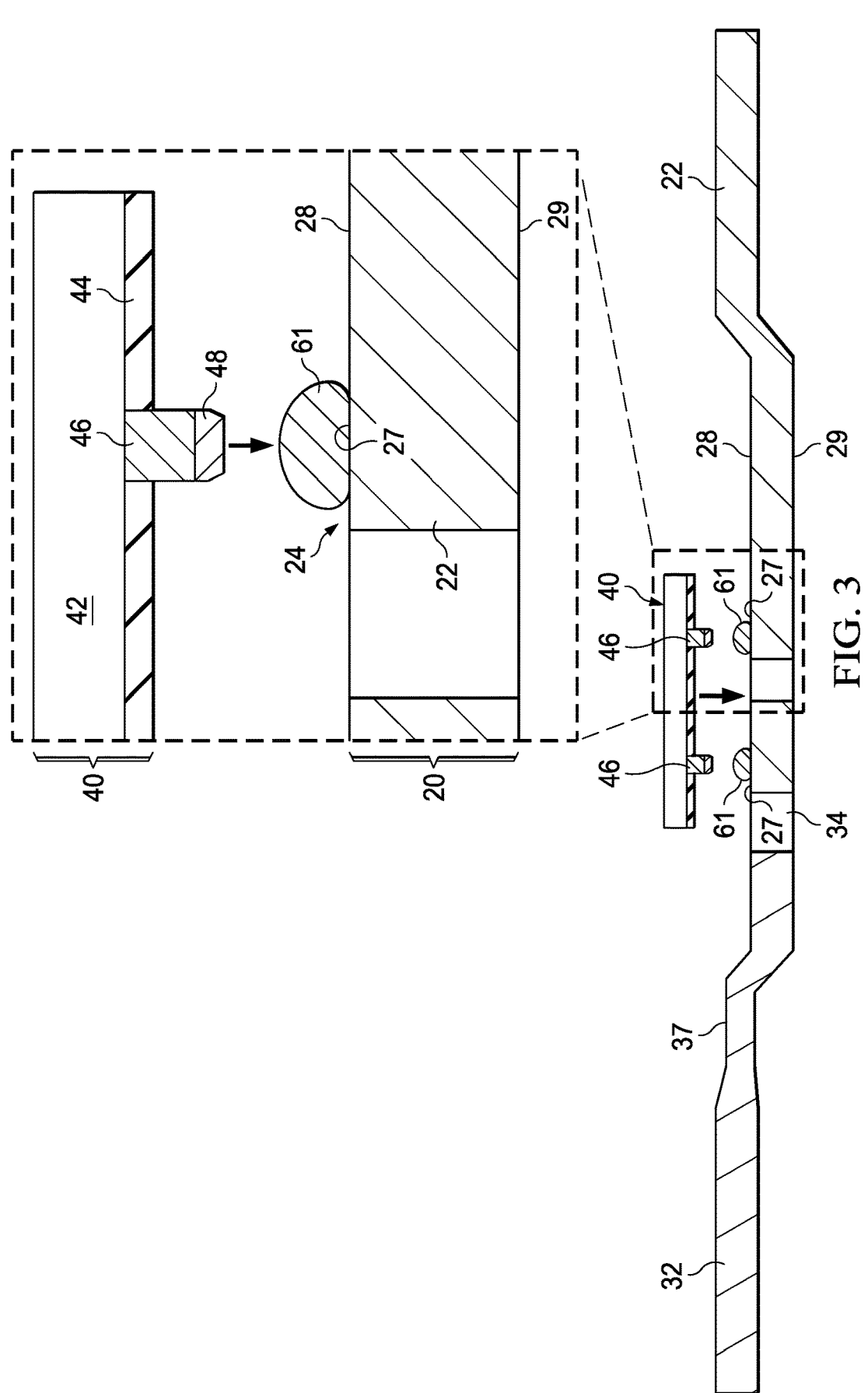
FIG. 3 illustrates a conceptual process step providing an alternative to FIG. 2A for manufacturing the semiconductor package of FIGS. 1A-1D.

In either case, as shown in FIG. 2B, semiconductor die 40 is positioned on die attach site 24 of die leads 22 of leadframe in a flip chip configuration. Then semiconductor die 40 is mounted to die attach site 24 by reflowing solder caps 48 on copper pillars 46 of semiconductor die 40 to form solder joints 49, which provide mechanical and electrical connections between copper pillars 46 and electrical contact areas 27 of die leads 22 in the flip chip configuration (FIG. 4, step 104).

Also shown in FIG. 2B, viscous polymeric precursor 61 is cured to form a set of solder joint capsules 60 covering each solder joint 49 against leadframe 20 (FIG. 4, step 106). Curing viscous polymeric precursor 61 to form solder joint capsules 60 may occur while reflowing solder caps 48 of each of copper pillars 46 to form solder joints 49. For example, if viscous polymeric precursor 61 includes a thermoset resin, heating the assembly of leadframe and semiconductor die 40 to reflow solder caps 48 may cure viscous polymeric precursor 61 while reflowing solder caps 48 to form solder joints 49. Defluxing the assembly of leadframe 20 and semiconductor die 40 may occur following the reflow to form solder joints 49.

Figure 2C:
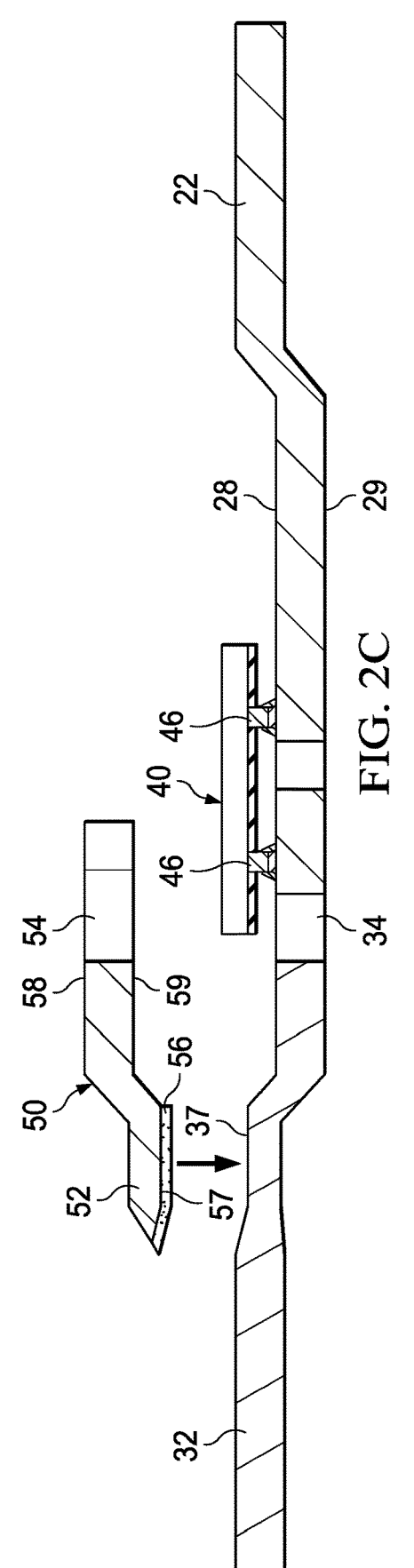
Figure 2D:
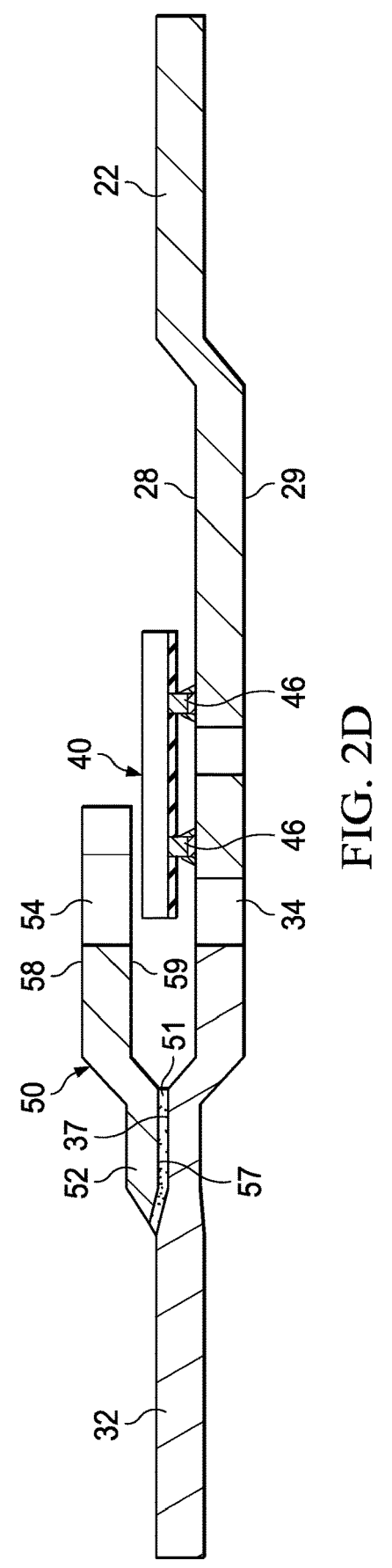

As shown in FIG. 2C, clip 50 is positioned on leadframe 20 over semiconductor die 40. Solder 56 may be screen printed on clip solder contact areas 57 of base 52 prior to positioning clip solder contact areas 57 on clip contact areas 37 of sensor coil leads 32. As shown in FIG. 2D, with clip 50 in position on sensor coil leads 32, solder 56 is reflowed to form clip solder joints 51 (FIG. 4, step 108). A second defluxing, this time of the assembly of leadframe 20, semiconductor die 40 and clip 50, may occur following the reflow to form clip solder joints 51.

Solder joints 49 of copper pillars 46 may remelt during while forming clip solder joints 51, but solder joint capsules 60 restrict flow of solder of each of copper pillars 46 to maintain the electrical connections between each of copper pillars 46 and electrical contact areas 27 of die leads 22 in the flip chip configuration.

Figure 2E:
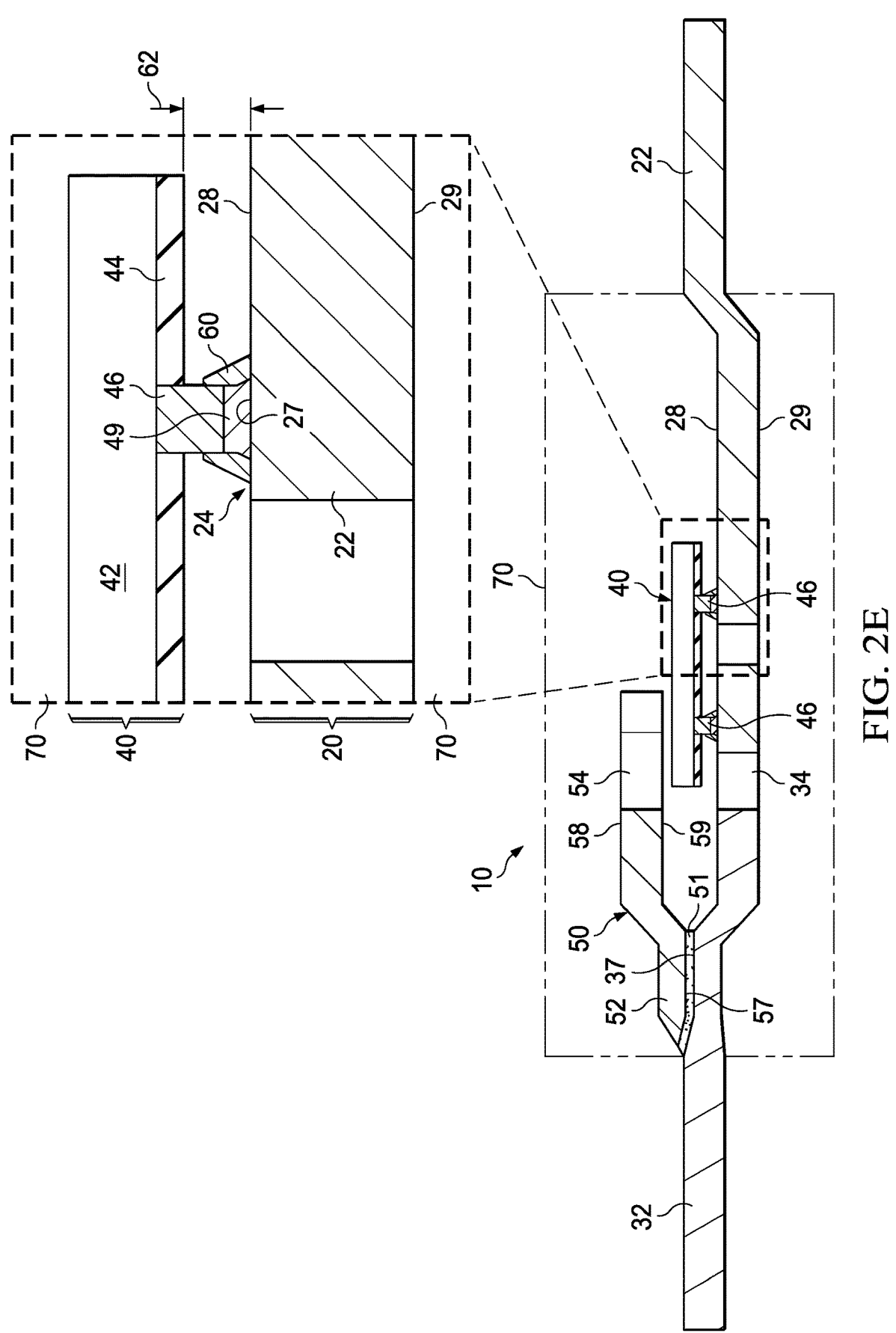
Figure 2F:
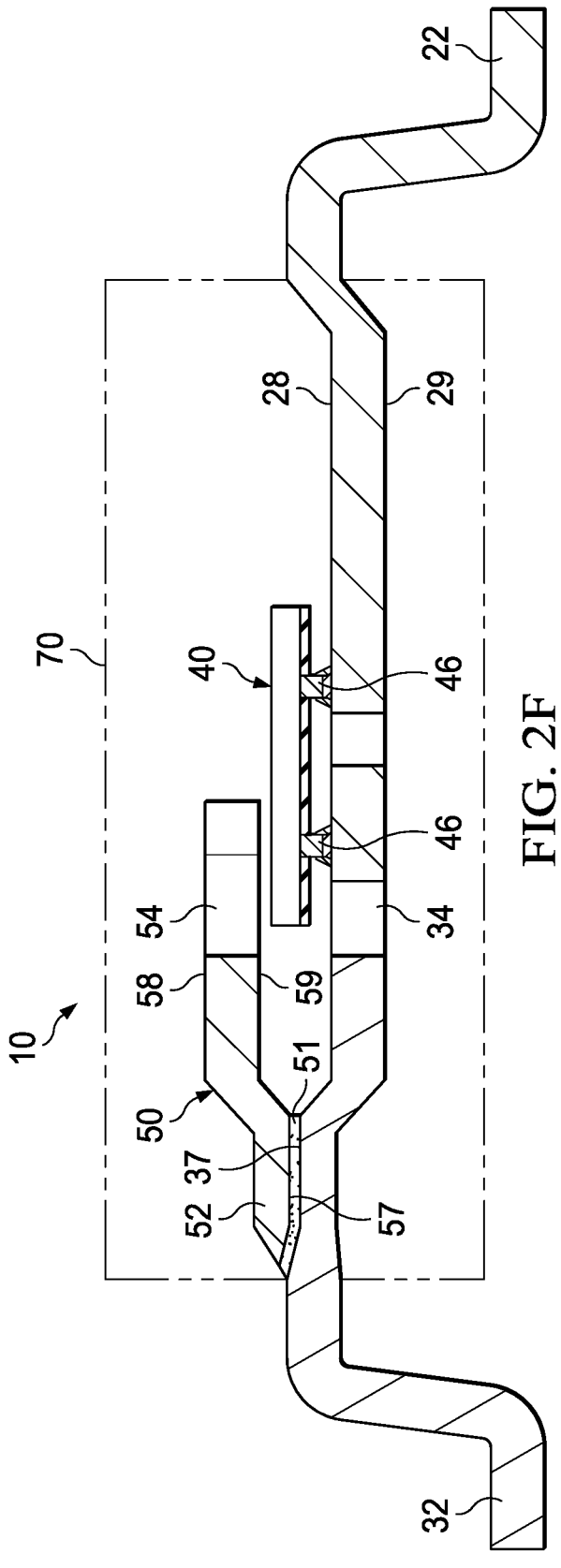

As shown in FIG. 2F, the assembly of FIG. 2E is molded to cover solder joints 49 of the flip chip configuration and solder joint capsules 60 and at least partially cover leadframe 20, semiconductor die 40, and clip 50 with mold compound 70, such as by placing the subassembly of FIG. 2E, including leadframe 20, semiconductor die 40, and solder joint capsule 60, in a mold cavity and transfer molding the subassembly (FIG. 4, step 110).

In some examples, semiconductor package 10 may be manufactured as part of an array of semiconductor packages on a common leadframe strip. In such examples, semiconductor die 40 is one of a plurality of semiconductor dies mounted on a plurality of leadframes in the leadframe strip with each die contact of the semiconductor dies being coated in a viscous polymeric precursor 61 prior to mounting to form solder joint capsules as described with respect to solder joint capsule 60. Following the mounting of the plurality of semiconductor dies, a clip strip including clip 50 is positioned on the leadframe strip over the semiconductor dies. Reflowing solder between clip 50 and leadframe 20 to form clip solder joints 51 includes reflowing solder between clips of the clip strip and leadframes of the leadframe strip to form a plurality of clip solder joints such as clip solder joints 51.

Mold compound 70 is then applied to each of the semiconductor packages on the leadframe strip with a single molding operation. Following molding of mold compound 70, semiconductor package 10 may be singulated from the array of interconnected semiconductor packages of the common mold (FIG. 4, step 112). For example, singulation may include cutting the leadframe strip including leadframe 20 and mold compound 70 within spaces separating the plurality of semiconductor dies from each other with a saw or other cutting implement.

Following singulation to form discrete semiconductor packages 10, leads 22, 32 extend beyond mold compound 70. Leads 22, 32 may then be bent as cantilevered leads suitable for surface mounting semiconductor package 10 to an external board, such as printed circuit board (PCB). In some examples, lead bending and singulation may occur in a single operation. In other examples, semiconductor packages including underfill within a gap between a sensor coil and a semiconductor die of the semiconductor package may include another lead configuration, such as, but not limited to, flat no-leads semiconductor package, such as quad-flat no-leads (QFN) or dual-flat no-leads (DFN). In such operations, singulation may including cutting through a common mold covering the plurality of leadframes of a leadframe strip to expose the electrical contacts for each discrete package of the leadframe strip.

Following singulation, semiconductor package 10 may be tested or placed into operation. In examples where semiconductor die 40 includes an analog magnetic sensor, such as a Hall sensor, and a controller, operation or testing of semiconductor package 10 may include receiving, with the controller, an analog input representing the magnetic fields created by electrical current through sensor coils 34, 54 from the sensor, and outputting, with the controller, digital signals representative of the electrical current through sensor coils 34, 54 via one or more of die leads 22.

The specific techniques for semiconductor packages with a clip soldered to a leadframe, and a semiconductor die mounted to the leadframe in a flip chip configuration with solder joint capsules surrounding each solder joint of the semiconductor die contacts in the flip chip configuration, such as semiconductor package 10, are merely illustrative of the general inventive concepts included in this disclosure as defined by the following claims.

What is claimed is:

1. A semiconductor package comprising:
   a sensor coil coupling a first lead to a second lead;
   a plurality of leads other than the first and second leads;
   a semiconductor die including a set of die contacts electrically connected to respective ones of the plurality of leads other than the first and second leads in a flip chip configuration, the semiconductor die extending over the sensor coil; and
   a clip soldered to the first and second leads, the clip extending over only a portion of, and not electrically connected to, the semiconductor die.

2. The semiconductor package of claim 1, wherein a solder joint capsule surrounds each electrical connection of one of the set of die contacts to one of the plurality of leads other than the first and second leads.

3. The semiconductor package of claim 1, wherein the plurality of leads other than the first and second leads form spaces in a die attach site between solder joints attaching the die contacts and the leads other than the first and second leads.

4. The semiconductor package of claim 1, further comprising a dielectric mold compound at least partially covering the first and second leads and the plurality of leads other than the first and second leads and covering, the semiconductor die, and the clip.

5. The semiconductor package of claim 4, wherein the first and second leads and the plurality of leads other than the first and second leads are bent in a common direction outside the dielectric mold compound and shaped as cantilevered leads.

6. The semiconductor package of claim 1, wherein each of the die contacts includes a metal pillar extending from an opening in a dielectric layer on an active side of the semiconductor die, through a solder joint capsule, and to one of the plurality of leads other than the first and second leads.

7. The semiconductor package of claim 6, further comprising a dielectric mold compound covering the set of solder joints of the flip chip configuration, the set of solder joint capsules, and the metal pillars, wherein the dielectric mold compound contacts each of the metal pillars adjacent to the dielectric layer on the active side of the semiconductor die.

8. A semiconductor package comprising:
a leadframe forming a plurality of leads with a die attach site;
a semiconductor die including a set of die contacts mounted to the die attach site in a flip chip configuration with each die contact of the set of die contacts electrically connected to leadframe via one of a set of joints formed from solder having a first melting temperature;
a set of solder joint capsules covering each of the set of solder joints; and
a clip mounted to the leadframe over the semiconductor die with a clip solder joint formed from solder having a second melting temperature higher than the first melting temperature.

9. A semiconductor package comprising:
a leadframe forming a plurality of leads with a die attach site, wherein the plurality of leads includes sensor coil leads and a plurality of die leads, and wherein the leadframe includes a first sensor coil between the sensor coil leads;
a semiconductor die including a set of die contacts mounted to the die attach site in a flip chip configuration with each die contact of the set of die contacts electrically connected to leadframe via one of a set of solder joints;
a set of solder joint capsules covering each of the set of solder joints against the leadframe; and
a clip mounted to the leadframe over the semiconductor die with a clip solder joint, wherein the clip includes a second sensor coil, the second sensor coil forming a parallel conductive path with the first sensor coil via the clip solder joint;
wherein the plurality of die leads are physically and electrically separated from the first sensor coil and the second sensor coil;
wherein the semiconductor die is positioned between the first sensor coil and the second sensor coil with a first gap separating the semiconductor die from the first sensor coil and a second gap separating the semiconductor die from the second sensor coil; and
wherein the semiconductor die includes a sensor operable to detect magnetic fields created by electrical current through the first sensor coil and the second sensor coil, the semiconductor die operable to output a signal representative of the detected magnetic fields via the die leads.

10. The semiconductor package of claim 9, wherein the first sensor coil is a first partial turn sensor coil and wherein the second sensor coil is a second partial turn sensor coil.

11. A semiconductor package comprising:
a sensor coil between sensor coil leads;

a plurality of leads spaced from the sensor coil leads;
a semiconductor die including a set of die contacts mounted to the plurality of leads spaced from the sensor coil leads in a flip chip configuration with each die contact of the set of die contacts electrically connected to one of the plurality of leads spaced from the sensor coil leads via a solder joint, the semiconductor die extending over the sensor coil; and
a clip soldered to at least one of the sensor coil leads, the clip extending over only a portion of, and not electrically connected to, the semiconductor die.

12. The semiconductor package of claim 11, further including an individual solder joint capsule completely covering each of the respective solder joints between the die contacts and the plurality of leads spaced from the sensor coil leads.

13. The semiconductor package of claim 12, wherein each solder joint capsule is formed from epoxy polymer flux.

14. The semiconductor package of claim 12,
wherein the solder joints between the die contacts and the plurality of leads spaced from the sensor coil leads are formed of solder that reflows at a first temperature, and
wherein a solder joint between the clip solder and at least one of the sensor coil leads is formed of solder that reflows at a second temperature, the second temperature being higher than the first temperature.

15. The semiconductor package of claim 14, wherein each solder joint capsule is formed from epoxy polymer flux.

16. The semiconductor package of claim 14, wherein the plurality of leads spaced from the sensor coil leads are bent in a common direction outside the dielectric mold compound.

17. The semiconductor package of claim 12, further comprising a dielectric mold compound covering the solder joints, the set of solder joint capsules and at least partially covering the sensor coil leads, the plurality of leads spaced from the sensor coil leads and the semiconductor die.

18. The semiconductor package of claim 12, wherein each of the die contacts includes a metal pillar extending from an opening of a dielectric layer on an active side of the semiconductor die, through one of the solder joint capsules, and to one of the set of solder joints.

19. The semiconductor package of claim 18, further comprising a dielectric mold compound covering the solder joints, the solder joint capsules, and metal pillars, wherein the dielectric mold compound contacts each of the metal pillars adjacent to the dielectric layer on the active side of the semiconductor die.

20. The semiconductor package of claim 12,
wherein the clip includes a second sensor coil, the second sensor coil forming a parallel conductive path with the first-sensor coil;
wherein the semiconductor die is positioned between the sensor coil and the second sensor coil with a first gap separating the semiconductor die from the sensor coil and a second gap separating the semiconductor die from the second sensor coil; and
wherein the semiconductor die includes a sensor operable to detect magnetic fields created by electrical current through the sensor coil and the second sensor coil, the semiconductor die operable to output a signal representative of the detected magnetic fields via the plurality of leads spaced from the sensor coil leads.

21. The semiconductor package of claim 11,
wherein the solder joints between the die contacts and the plurality of leads spaced from the sensor coil leads are formed of solder that reflows at a first temperature, and

wherein a solder joint between the clip solder and at least one of the sensor coil leads is formed of solder that reflows at a second temperature, the second temperature being higher than the first temperature.

22. The semiconductor package of claim 11, further comprising a dielectric mold compound covering the solder joints, the semiconductor die and at least partially covering the plurality of leads spaced from the sensor coil leads.

* * * * *